United States Patent
Haaland et al.

[11] Patent Number: 5,991,081
[45] Date of Patent: Nov. 23, 1999

[54] ANTI-REFLECTION COATINGS AND COATED ARTICLES

[76] Inventors: Peter D. Haaland, 518 W. Linden St., Louisville, Colo. 80027; B. Vincent McKoy, 3855 Keswick Rd., Flintridge, Calif. 91011

[21] Appl. No.: 08/990,003

[22] Filed: Dec. 12, 1997

Related U.S. Application Data

[60] Provisional application No. 60/037,239, Jan. 27, 1997.

[51] Int. Cl.$^6$ .................................................. G02B 5/28
[52] U.S. Cl. ....................................... 359/589; 359/580
[58] Field of Search .................................. 359/580, 581, 359/582, 586, 588, 589, 590; 428/421, 422; 427/164, 165

[56] References Cited

U.S. PATENT DOCUMENTS

| | | |
|---|---|---|
| 3,356,522 | 12/1967 | Libbert . |
| 4,058,638 | 11/1977 | Morton ........................................ 427/39 |
| 4,096,315 | 6/1978 | Kubacki ...................................... 428/412 |
| 4,130,672 | 12/1978 | Onoki et al. ............................... 427/164 |
| 4,172,156 | 10/1979 | Ritter et al. ................................. 427/38 |
| 4,311,725 | 1/1982 | Holland ....................................... 427/10 |
| 4,374,158 | 2/1983 | Taniguchi et al. ........................... 427/41 |
| 4,599,272 | 7/1986 | Ichikawa ................................... 428/412 |
| 4,632,844 | 12/1986 | Yanagihara et al. ........................ 427/38 |
| 4,815,962 | 3/1989 | Cardone ...................................... 427/38 |
| 4,830,873 | 5/1989 | Benz et al. .................................. 427/35 |
| 4,842,941 | 6/1989 | Devins et al. ............................. 428/412 |
| 4,906,844 | 3/1990 | Hall ........................................... 250/225 |
| 5,053,244 | 10/1991 | Kieser et al. ................................ 427/38 |
| 5,093,152 | 3/1992 | Bonet et al. ................................. 427/40 |
| 5,171,414 | 12/1992 | Amberger et al. .................... 204/192.26 |
| 5,181,141 | 1/1993 | Sato et al. .................................. 359/580 |
| 5,181,142 | 1/1993 | Asai et al. .................................. 359/589 |
| 5,225,244 | 3/1993 | Aharoni et al. ............................ 427/240 |
| 5,246,782 | 9/1993 | Kennedy et al. ........................... 428/421 |
| 5,264,724 | 11/1993 | Brown et al. .............................. 257/347 |
| 5,354,575 | 10/1994 | Dagenais et al. ............................ 427/10 |
| 5,415,927 | 5/1995 | Hirayama et al. ......................... 359/589 |
| 5,443,941 | 8/1995 | Bariya et al. .............................. 430/313 |
| 5,449,558 | 9/1995 | Hasegawa et al. ........................ 428/422 |
| 5,476,717 | 12/1995 | Floch ......................................... 428/421 |
| 5,541,770 | 7/1996 | Pellicori et al. ........................... 359/588 |
| 5,580,606 | 12/1996 | Kai ............................................ 427/164 |
| 5,597,609 | 1/1997 | Beisswenger et al. ........................ 427/8 |
| 5,728,456 | 3/1998 | Adair et al. ............................... 428/216 |
| 5,789,040 | 8/1998 | Martinu et al. ............................ 427/575 |

FOREIGN PATENT DOCUMENTS

| | | |
|---|---|---|
| 0112418 | 7/1984 | European Pat. Off. . |
| 112418 A1 | 7/1984 | European Pat. Off. ............... 359/589 |
| 0451618 | 10/1991 | European Pat. Off. . |
| 3627248 | 4/1987 | Germany . |
| 4338040 | 5/1995 | Germany . |
| 4-191701 | 4/1992 | Japan . |
| 04191701 | 7/1992 | Japan ..................................... 359/589 |
| 1530833 | 11/1978 | United Kingdom . |
| WO9308489 | 4/1993 | WIPO . |

OTHER PUBLICATIONS

Japanese Patent Abstract, Publication No. 01238601, Publication Date Sep. 1989.

(List continued on next page.)

*Primary Examiner*—Cassandra Spryou
*Assistant Examiner*—E. Cherry
*Attorney, Agent, or Firm*—Christie, Parker & Hale, LLP

[57] ABSTRACT

Anti-reflection (AR) coatings and coated articles are described. The thickness and composition of the coatings are determined by minimizing the product of the Fresnel reflection coefficients for a coating with the angular- and wavelength-dependent sensitivity of the human visual system to minimize the perceived reflectance for the coated article. A compact chamber is evacuated and flushed with chemically inert gas such as argon or nitrogen. One or more molecular precursors are deposited using plasma-enhanced chemical vapor deposition (PECVD) to form AR films. Single-layer AR coatings based on fluoropolymer films of controlled thickness, as well as organic, organosilicon, and/or inorganic multilayers are described.

15 Claims, 13 Drawing Sheets

OTHER PUBLICATIONS

Japanese Patent Abstract, Publication No. 04191701, Publication Date Jul. 1992.

Japanese Patent Abstract, Publication No. 08017743, Publication Date Jan. 1996.

Gotoh et al.; "Analysis of Polymer Formation During $SiO_2$ Microwave Plasma Etching"; Jpn. J. Appl. Phys. vol. 34 (1995) pp. 2132–2136.

Groh et al; "What is the Lowest Refractive Index of an Organic Polymer?"; Macromolecules 1991, vol. 24, pp. 660–663.

Database WPI; Section Ch, Week 9750; Derwent Publications Ltd., JP 09 258 004; Oct. 1997.

Applied Vision; Plasma Coat Express; "Anti–Reflection Coating at the Point of Sale"; Brochure Date 1995 (or later).

Endo et al.; "Fluorinated Amorphous Carbon Thin Films Grown From $C_4F_8$ For Multilevel Interconnections of Integrated Circuits"; NEC Research & Development, vol. 38, No. 3, pp. 286–293, Jul. 1997.

Born et al.; "Electromagnetic Theory of Propagation, Interference and Diffraction of Light"; Principles of Optics; pp. 46–70, 1980.

Wandell, Brian A.; "The Photoreceptor Types"; Foundations of Vision Science; 1995.

H.A. Macleod; "Antireflection Coatings"; Thin–Film Optical Filters; Chapter 3, pp. 70–136, 1986.

H.A. Macleod; "Production Methods and Thin–Film Materials"; Thin–Film Optical Filters; Chapter 9, pp. 357–411, 1986.

H.A. Macleod; "Appendix Characteristics of Thin–Film Materials"; Thin–Film Optical Filters; pp. 504–511, 1986.

Wyszecki et al.; "Concepts and Methods, Quantitative Data and Formulae"; Color Science; pp. 392–420, 1982.

Wade et al.; "Visual Perception"; pp. 45–62, 1991.

Furman et al.; "Basics of Optics of Multilayer Systems", pp. 176–183, 192.

Seferis, James "Refractive Indices of Polymers"; Polymer Handbook; VI, pp. 451–461, 1975.

Wydeven et al.; "Antireflection Coating Prepared by Plasma Polymerization of Perfluorobutene–2"; Applied Optics, vol. 15, No. 1, pp. 132–136, Jan. 1976.

ANTI-REFLECTION COATINGS AND COATED ARTICLES

CROSS-REFERENCE TO RELATED APPLICATION

This application claims priority of Provisional U.S. patent application Ser. No. 60/037,239, filed Jan. 27, 1997, the subject matter of which is fully incorporated herein.

BACKGROUND OF THE INVENTION

The present invention generally relates to improving the transmission of light through optical materials, such as spectacle lenses and, at the same time, reducing reflection of stray light that leads to glare from optical materials.

All uncoated optically transparent materials reflect a portion of incident light. The amount of reflection varies with the wavelength, polarization, and angle of incidence of the light as well as the wavelength-dependent refractive index of the transparent material. This Fresnel reflection is described by Maxwell's equations for electromagnetic radiation, as known to those practiced in the art of optics and described, for example, by M. Born and E. Wolf in *Principles of Optics*, New York, Pergammon Press (1980). It is also known that layers of transmissive materials with refractive indices different from that of the substrate can reduce the amount of reflection. The amount of this reduction depends on the wavelength-dependent refractive index of the coating materials and their thickness as well as the wavelength, polarization, and angle of incidence of the light. The design and manufacture of these coatings is thoroughly described in Chapters 3 and 9 of H. A. Macleod, *Thin Film Optical Filters*, (New York: McGraw-Hill) (1989).

The sensitivity of the human visual system also varies with the wavelength of light and its angle of incidence, as described, for example, in *Color Science: Concepts and Methods, Quantitative Data and Formulae* by Gunter Wyszecki and W. S. Stiles (New York: Wiley) (1982) and *Visual Perception* by Nicholas Wade and Michael Swanston (London: Routledge)(1991).

It would be advantageous to exploit this human visual response function by designing and fabricating coated optical articles having coating thicknesses and compositions that result in a minimization of the perceived angular and wavelength variation of Fresnel reflection from the articles.

Prior methods for creating anti-reflection (AR) coatings employ physical vapor deposition in which high-energy electron beams are used to heat samples of inorganic materials such as titanium (Ti), silicon (Si), or magnesium fluoride ($MgF_2$) in a vacuum chamber until they evaporate and deposit on the cooler substrate. The flux of evaporated material is isotropic and decreases with the square of the distance between the substrate to be coated and the evaporative source. The method requires a vacuum chamber whose dimensions are large compared to the dimensions of the substrate. Typical implementations of such methods are found in the Model 1100 High Vacuum Deposition System (Leybold-Hereaus GmbH, Hanau, Germany) and the BAK 760 High Vacuum Coating System (Balzers A. G., Liechtenstein). The rate of producing AR coatings with prior methods, as well as the high cost to purchase, operate, and maintain the apparatus, restricts their use to central production facilities. It is, therefore, desirable to provide a method for producing AR coatings on spectacle lenses that only requires compact, inexpensive hardware and can be performed at any location, such as a retail optician's office.

The evaporative method also causes heating of the substrate because convective cooling is inefficient in a vacuum and the hot elemental materials emit thermal radiation that may be absorbed by the substrate. The heating can cause substrate damage, such as internal stress and warping, especially with plastic substrates. It is, therefore, desirable to produce the AR coating at or near room temperature to avoid this damage.

Known AR coatings use one or more layers of refractory materials, such as inorganic oxides, nitrides, or fluorides, to achieve a reduction in reflection. Common thin-film materials used for such AR coatings are described in chapter 9 and Appendix I of Macleod, and include oxides of Al, Sb, Be, Bi, Ce, Hf, La, Mg, Nd, Pr, Sc, Si, Ta, Ti, Th, Y, and Zr. Macleod's tabulation also includes fluorides of Bi, Ca, Cc, Na, Pb, Li, Mg, Nd, a, and Th, as well as a few sulfides and selenides. A similar tabulation is found in table 4.1 on page 179 of *Optics of Multilayer Systems* (Sh. A. Furman and A. V. Tikhonravov, Editions Frontieres: Gif-sur-Yvette, France, 1992).

A problem with these AR coatings is that the mechanical characteristics of inorganic compounds, such as thermal expansion coefficient and elastic modulus, are very different from those of plastic substrates. It would therefore, be advantageous to produce an organic AR coating layer. It is also desirable to produce an AR coating layer whose properties are intermediate between known inorganic AR coatings and plastic substrates to act as a transition layer between organic and inorganic layers.

The reflectance of a coated optical article depends crucially on the thickness of the AR coating layer or layers. In the prior art, coating thickness has been monitored using a quartz microbalance in situ to measure the rate of mass deposition. The mass of the film does not enter directly into the equations that describe the optical properties of the layer. It would be highly advantageous to monitor film growth with an optical signal that is tied more directly to the AR properties of the coated article.

SUMMARY OF THE INVENTION

In accordance with the present invention, an anti-reflection (AR)coating is designed using the wavelength- and angle-dependent refractive properties of one or more thin layers on an optical substrate. A perceived reflectance, which weights the angle- and wavelength-dependent Fresnel reflectance by the angle and wavelength sensitivity of the human visual system, is minimized subject to constraints imposed by available layer materials.

The layers (also referred to an "coatings" or "films") are formed by plasma-enhanced chemical vapor deposition (PECVD) of volatile precursors such as $c-C_4F_8$, $Si(CH_3)_4$, $Ti(OC_2H_5)_4$, $C_4H_4O$, and $C_6H_6$. The composition of the precursors includes organic and organometallic compounds, and the resulting layers may be optically dispersive (i.e. have a variation of refractive index with wavelength). Alternatively, the resulting layer(s) may not be optically dispersive.

A compact chamber, slightly larger than the substrate to be coated, is evacuated and flushed with a chemically inert gas. Electrical energy is deposited into the gas, either directly, using electrodes and applying a static electric field, or indirectly, through capacitive or inductive coupling using time-varying electric fields. The result is a weakly ionized plasma. The substrate is preferably cleaned by, e.g., sputtering the surface with positive ions produced in an inert gas plasma (e.g. He, Ar, $N_2$) or by etching the surface in a reactive plasma (e.g. $O_2$, HBr). One or more volatile molecular precursors are then admitted to the chamber either alone, or mixed with the inert gas flow, and electrically excited. The electrical energy excites, dissociates, and ionizes the precursor(s), producing reactive fragments that are transported to the lens surface and polymerize or coalesce to form a film.

In one embodiment of the invention, an AR layer is formed by cations (e.g. $C_2F_4^+$, $Si(CH_3)_3^+$) that are accelerated by the electrostatic sheath at the boundary of the plasma to superthermal kinetic energies (greater than 0.025 eV). These layers have refractive properties that depend on the precursor, the deposition conditions, and the film thickness. Both single and multiple layer AR coatings are prepared in this manner.

In a preferred embodiment, an AR film has at least one layer of a polymeric fluorocarbon, such as is produced by PECVD of $c$-$C_4F_8$, $C_2F_4$, or other perfluorinated precursor materials. These fluoropolymer films have refractive indices generally less than 1.4 and can serve as useful, single layer AR coatings as well as elements in multilayer designs.

In another embodiment, an organometallic layer such as is formed by PECVD of $(CH_3)_4Si$ or $(CH_3)_3SiH$ is used to improve the bonding between an organic substrate or layer and an inorganic substrate or layer. In another embodiment, one or more optically thin metal layers, such as a layer of chromium, can be deposited from an organometalic precursor, such as chromyl chloride, to improve adhesion of the layer(s).

The present invention also provides a method for optically monitoring substrate cleaning and film growth using a polarized, light-emitting diode, a polarizing optical filter, and a photodiode. Feedback from the optical monitor is used to control the cleaning and AR deposition by, for example, controlling the precursor flow rates, chamber pressure, or electrical excitation, either alone, or in combination, to produce single and multilayer films or coatings with prescribed anti-reflection properties.

DESCRIPTION OF THE PREFERRED EMBODIMENTS

The present invention provides methods and apparatus for reducing reflection on optical substrates, and new, single and multilayer AR coatings on optical substrates. As used herein, the terms "optical materials," "optical substrates," and "optical articles" refer to normally transparent or translucent materials such as glass and plastic, and articles made of such materials. Nonlimiting examples of such articles include lenses, windows, television and computer monitor screens, and windshields.

Reflectance, R, is the ratio of the intensity of the reflected portion of light, $I_r$, to the intensity of the incident probe light, $I_i$:

$$R(\lambda, \theta, P) = \frac{I_r}{I_i} = \rho\rho^* = \frac{|y_0 \cdot y_i|^2}{|y_0 \cdot y_i|^{2*}} \tag{1}$$

The reflectance varies with the wavelength of light, $\lambda$, the angle of incidence, $\theta$, and the light's polarization P. It is equal to the product of the Fresnel reflection coefficient, $\rho$, and its complex conjugate $\rho^*$, which can also be expressed in terms of optical admittances for the substrate medium $y_0$ and the incident medium $y_r$. The optical admittance is $$y = 2.6544 \times 10^{-3}(n-ik) = (C/B) \tag{2}$$

where n is the real part of the refractive index, k is the absorptive (imaginary) part of the refractive index, and the numerical constant is a conversion factor for SI units. The optical admittance of an optical article when one or more thin layers is added to a substrate whose admittance is $\eta_m$ becomes $y=(C/B)$ where C and B are computed by solving the matrix equation $$\begin{bmatrix} B \\ C \end{bmatrix} = \left( \prod_{r=1}^{q} \begin{bmatrix} \cos\delta_r & (i\sin\delta_r)/\eta_r \\ i\eta_r\sin\delta_r & \cos\delta_r \end{bmatrix} \right) \begin{bmatrix} 1 \\ \eta_m \end{bmatrix} \tag{3}$$

where $\eta_r$ is the tilted optical admittance of a particular one of the layers. In equation (3) the argument of the trigonometric functions for each layer r whose physical thickness is $d_r$ is $$\delta_r = 2\pi(n-ik)d_r\cos(\theta_r)/\lambda, \tag{4}$$

At normal incidence, ($\theta=0$) and the admittance is the same for any polarization. At other angles of incidence one splits the incident wave into two polarizations, p and s, and defines tilted optical admittances $$\eta_p = 2.6544 \times 10^{-3}(n-ik)/\cos(\theta)$$

$$\eta_s = 2.6544 \times 10^{-3}(n-ik) \times \cos(\theta) \tag{5}$$

leading to general reflectance R, transmission T, and absorption A via the formulae:

$$R = \left(\frac{\eta_0 B - C}{\eta_0 B + C}\right)\left(\frac{\eta_0 B - C}{\eta_0 B + C}\right)^* \quad (6)$$

$$T = \frac{4\eta_0 Re(\eta_m)}{(\eta_0 B + C)(\eta_0 B - C)^*}$$

$$A = \frac{4\eta_0 Re(BC^* - \eta_m)}{(\eta_0 B + C)(\eta_0 B - C)^*}$$

where the subscripts 0 and m refer to the incident medium and substrate, respectively. The derivation of these equations is described in chapter 1 by H. A. Macleod, op. cit.

Figure 1:
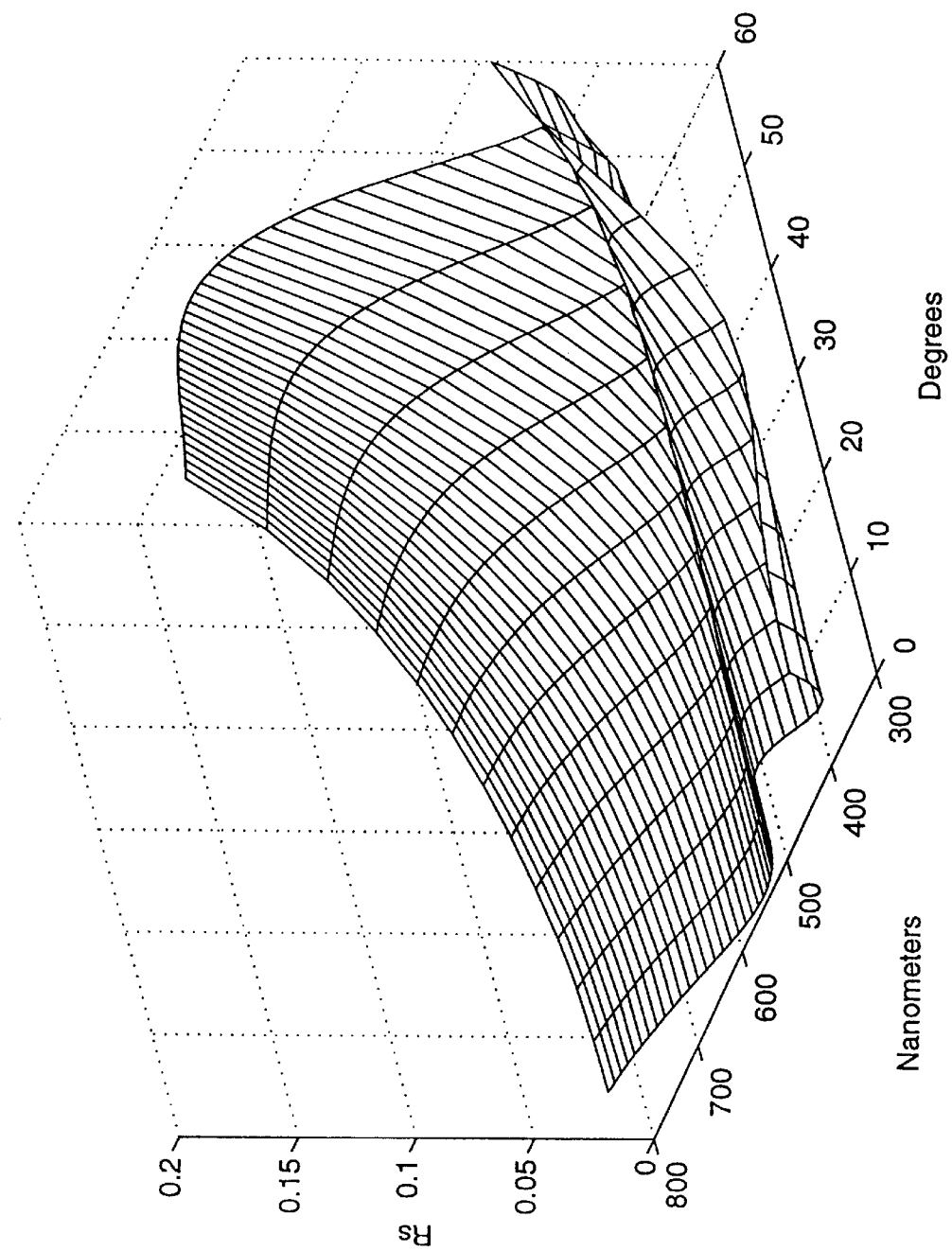
FIG. 1 is a 3-dimensional plot of s-polarized reflectance as a function of wavelength and incident angle for an AR coating according to one embodiment of the invention.
Figure 2:
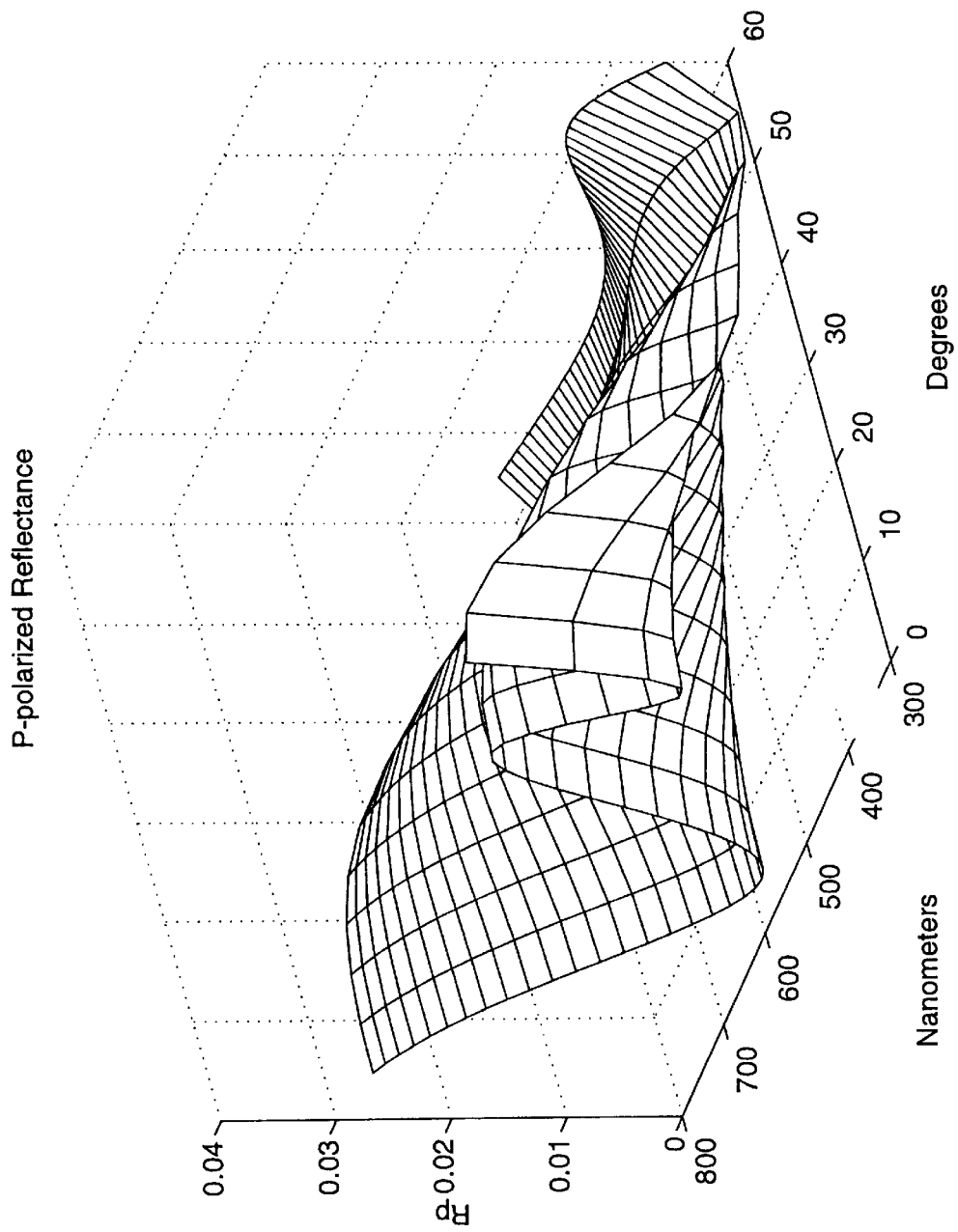
FIG. 2 is a 3-dimensional plot of p-polarized reflectance as a function of wavelength and incident angle for the subject AR coating of FIG. 1.

Examples of the solution to these equations using wavelengths between 300 and 750 nm and angles up to 60 degrees for a polycarbonate substrate coated with 200 nm of $SiO_2$ and 135 25 nm of $CF_x$ polymer are shown for s- and p-polarized light in FIGS. 1 and 2. Changes to the substrate, the refractive properties of layers, or the order in which they are coated onto the substrate, lead to complex but readily calculable changes in the reflectance $R(\lambda, \theta, P)$.

The sensitivity of human vision varies both with optical wavelength and angle of incidence, as discussed, for example, in *Color Science: Concepts and Methods, Quantitative Data and Formulae* by Gunter Wyszecki and W. S. Stiles (New York: Wiley) (1982) and *Visual Perception* by Nicholas Wade and Michael Swanston (London: Routledge) (1991). The human visual system is not, however, sensitive to polarization.

Figure 3:
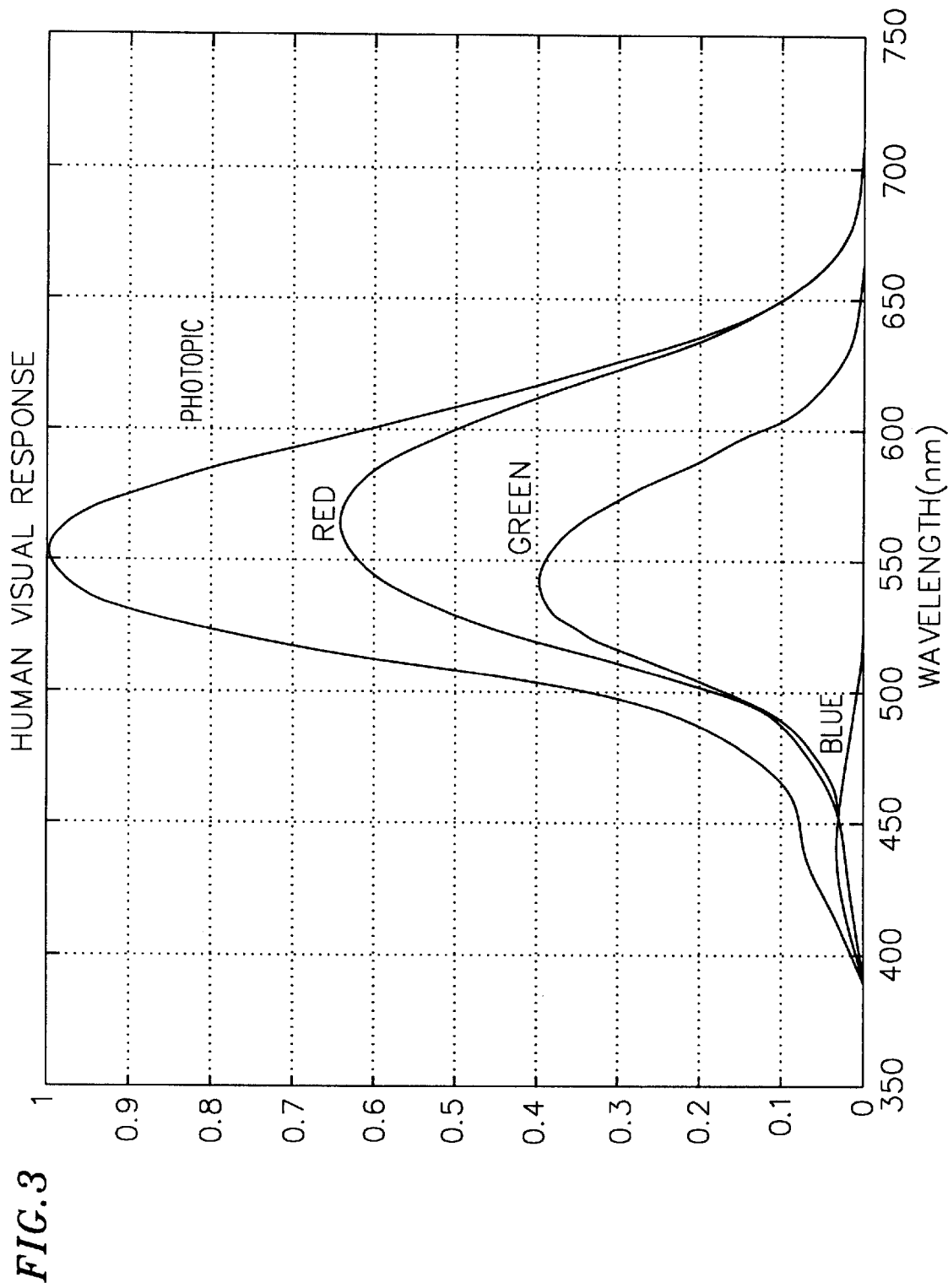
FIG. 3 is a plot of the human visual response as a function of wavelength.

The variation of human visual sensitivity with wavelength, $S(\lambda)$, is graphically presented in FIG. 3, which shows the sensitivity for each cone pigment (nominally red, green, and blue), as well as the sum of the responses. This sum is referred to as the photopic response.

Figure 4:
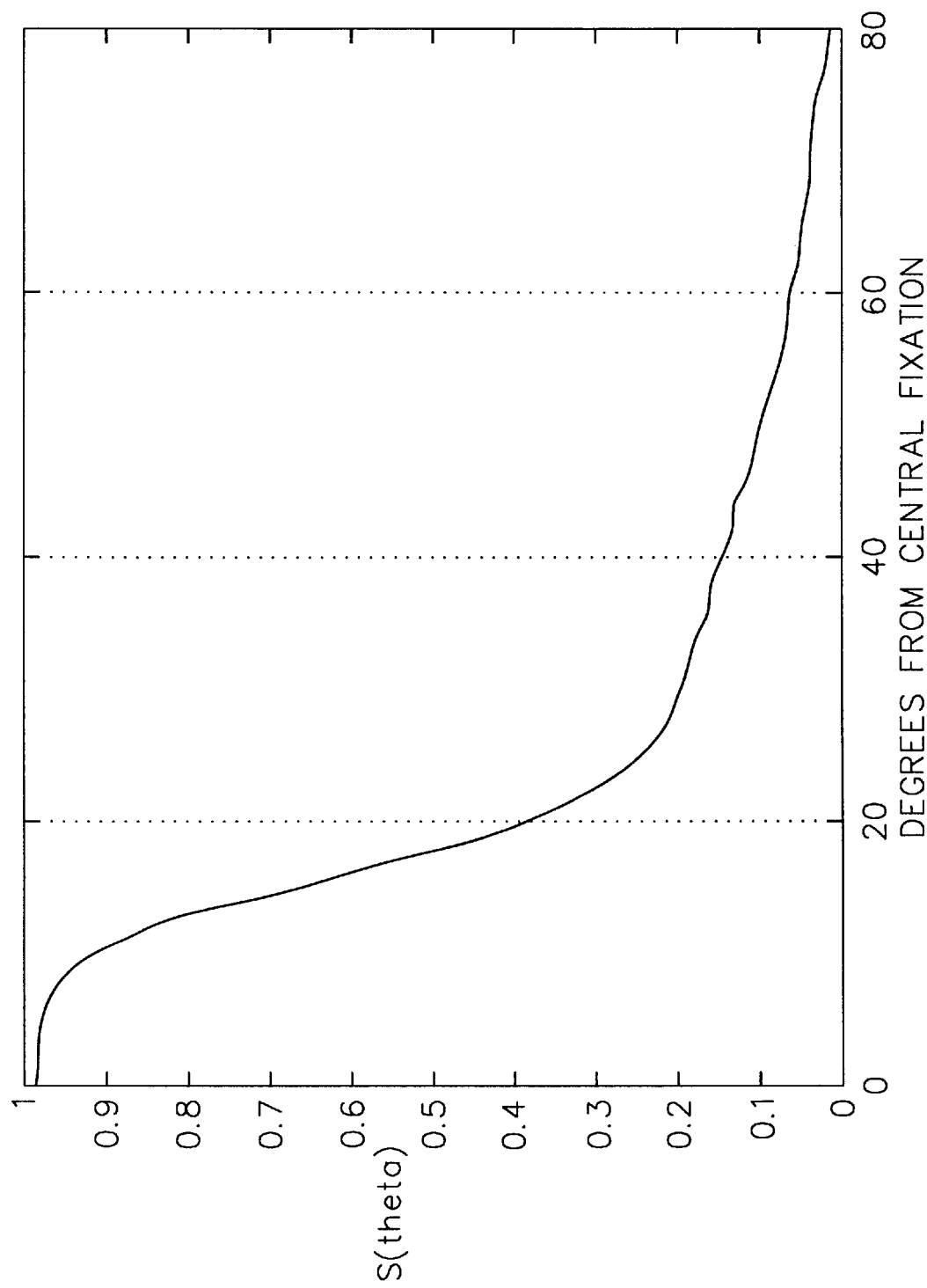
FIG. 4 is a plot of the human visual response as a function of incident angle.

FIG. 4 illustrates average values for human visual sensitivity to light as a function of angle, $S(\theta)$, over a range of angles. Although the human eye detects light that is refracted through the cornea over a horizontal angular spread of 208 degrees and a vertical spread of 120 degrees, the eye does not sense light throughout this range of angles with equal sensitivity and fidelity; this variability is described by $S(\theta)$. As is the case for ophthalmic prescriptions, there are average values and standard deviations from these average values, which are reported in Brian Wandell, *Foundations of Vision*, (Sunderland, M A: Sinauer Associates)(1995). As shown in FIG. 3, the highest human visual sensitivity to wavelength occurs at about 550 nm. As shown in FIG. 4, the highest human visual sensitivity to angle occurs within about twenty degrees from central fixation. The function $S(\theta)$ depends on physiologically variable details such as the size and location of the nose, corneal structure and optical homogeneity, and other factors familiar to those practiced in the art of psychophysical perception.

According to the present invention, the design of an AR coating is based on perceived reflectance. The perceived reflectance, F, of light from a surface by a human observer is defined as the integral of the product of the reflectance, $R(\lambda, \theta)$, and the human sensitivity function, $S(\lambda, \theta)$:

$$F = \int\int S(\lambda,\theta) R(\lambda,\theta) d\lambda d\theta \quad (7)$$

where $R(\lambda, \theta)$ is the average of the p- and s-polarized reflectances and is used because the human visual system in not sensitive to polarization.

The value of F depends on the wavelength-dependent refractive indices of the substrate and layer media, and on the thickness of the layers.

According to one aspect of the invention, statistically determined average values of $S(\lambda, \theta)$ for a given population of humans are used to determine the preferred response factor to be used in designing an AR coating. However, construction of individual profiles for individuals with peculiar constraints on $S(\theta)$ such as would occur, for example, in individuals that are blind in one eye or that suffer from macular degeneration, are also encompassed by the invention.

The perceived reflectance, F, is numerically evaluated for one or more layers on an optical substrate as a function of the thickness, composition, and order in which they are coated on the substrate. $R(\lambda, \theta)$ is calculated over a range of thicknesses for each layer of an AR coating. For a multilayer AR coating, $R(\lambda, \theta)$ is calculated over a range of thicknesses for each layer while keeping the thicknesses of the other layers constant, whereas, for a single layer AR coating, $R(\lambda, \theta)$ is merely calculated over a range of thicknesses for the single layer. For example, in designing an optimal multilayer AR coating comprising a first layer of $TiO_x$ on the substrate, having a physical thickness $d_1$, and a second layer of $CF_x$, having a physical thickness $d_2$, $R(\lambda, \theta)$ is calculated for a given $d_2$ of the $CF_x$ layer, e.g. 10 nm, and so on, such that a range of $d_1$ is calculated over a range of $d_2$, again say, over 5–300 nm at 5 nm intervals. From equation (7), perceived reflectance, F, is calculated for this AR coating from the product $R(\lambda,\theta) \times S(\lambda,\theta)$ for the calculated values of $R(\lambda,\theta,d)$ over the range of thickness $d_1$ (=5 to 300 nm) and $d_2$ (=5 to 300 nm). One or more minimum values of F are then determined from the calculated values of F over the range of thicknesses $d_1$, $d_2$.

The composition and order may be constrained by other material factors such as adhesion, surface energy, chemical resistance, etc. According to the present invention, the preferred thickness, composition, and order of the layers in an AR coating minimizes the value of F subject to these constraints.

According to one embodiment of the invention, an optical substrate having an average perceived reflectance $F_o$ is coated with an AR coating designed as described above, such that the average perceived reflectance of the coated article, $F_{AR}$, is less than $F_o$, and preferably less than or equal to about one-half of $F_o$. As used herein, "average perceived reflectance" is the perceived reflectance calculated from statistically determined average values of the human sensitivity response, $S(\lambda, \theta)$.

Once a preferred substrate and layer(s) system is defined (in terms of compositions, thicknesses, and orders of deposition), the next step is preparation of the coated article.

In accordance with the present invention, one or more substrates, such as an ophthalmic lens, is placed in a compact chamber, slightly larger than the substrate(s) to be coated. Preferably, the chamber has a volume no greater than about twice the volume of the substrate(s) to be coated. The chamber is evacuated and flushed with a chemically inert gas, such as argon or nitrogen. The inert gas is excited with electrical power to produce a plasma. The substrate surface is cleaned, either by sputtering from the inert gas (e.g. He, $N_2$, Ar) or by chemically etching the surface using a reactive gas (e.g. $O_2$, HBr), as is familiar to those practiced in the art of plasma processing.

One or more molecular precursors (described below) are mixed with the inert gas flow and excited with electrical power to produce a plasma. The plasma excites, dissociates, and ionizes the precursor, producing reactive fragments that are transported to the surface of the substrate and polymerize to form films. These films have refractive properties that depend on the precursors, the deposition conditions, and film thicknesses; therefore, a wide variety of single layer and multilayer coatings that reduce reflection can be synthesized. Nonlimiting examples of molecular precursors, the composition of the resulting film, and the average film refractive index are presented in Table I.

TABLE I

Typical precursors for low-pressure plasma synthesis of antireflecting films.

| Film | Precursor | Refractive Index | Phase |
|---|---|---|---|
| $SiO_2$ | $Si(OC_2H_5)_4$ | 1.52 | liquid |
| $SiC_3$ | $Si(CH_3)_4$ | 1.45 | liquid |
| $SiC_3$ | $HSi(CH_3)_3$ | 1.45 | gas |
| —$CSC_2H_2C$— | $C_4H_4S$ (thiophene) | 1.60 | liquid |
| —$COC_2H_4C$— | $C_4H_4O$ (furan) | 1.55 | liquid |
| —$C_6H_4$— | $C_6H_6$ (benzene) | 1.65 | liquid |
| $TiO_x$ | $Ti(OC_2H_5)_4$ | 2.2 | liquid |
| $TiN_x$ | $Ti(N(C_2H_5)_2)_4$ | 2.3 | liquid |
| $CF_x$ | $C_2F_4$ | 1.35–1.4 | gas |
| $CF_x$ | other fluorocarbons | 1.35–1.4 | variable |
| $CF_x$ | $c$-$C_4F_8$ | 1.35 | gas |

It has been found that a particularly useful class of precursors comprises perfluorinated organic compounds, such as perfluoroaliphatic, perfluorocycloaliphatic, and other fluorocarbon compounds. Nonlimiting examples include perfluorocyclobutane, hexafluoroethane, tetrafluoroethylene, and hexafluoropropene. Polymeric fluorocarbon films made by plasma deposition of such precursors have very low indices of refraction, typically less than 1.4, making them well suited for use in anti-reflection coatings. The theoretical basis for the low refractive index of fluoropolymer materials is discussed by W. Groh and A. Zimmerman in *Macromolecules*, 24, 6660-3 (1991). Previously, fluoropolymer films have been widely employed for their beneficial lubricious properties, as well as their ability to repel water and improve substrate cleaning. Such properties typically do not vary appreciably with the thickness of the fluoropolymer film.

Figure 5:
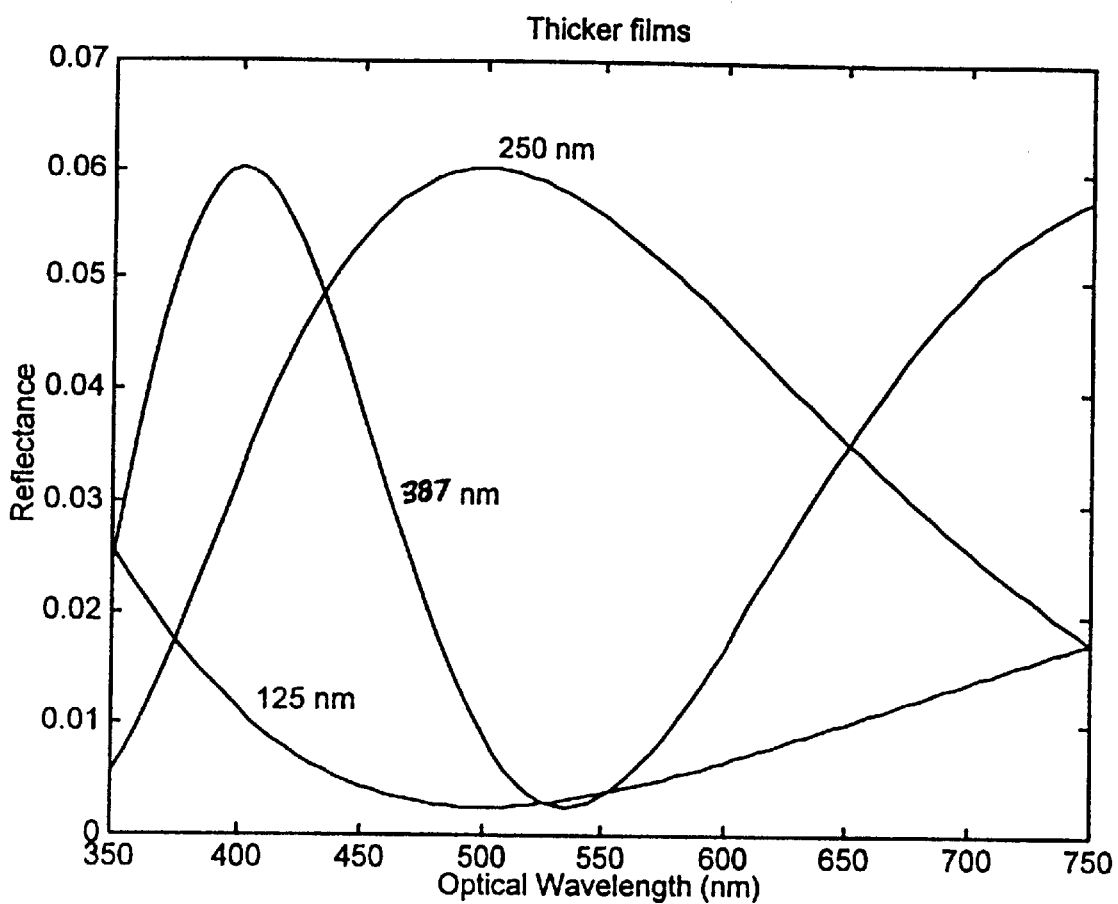
FIG. 5 is a plot of reflectance as a function of wavelength for several optical thicknesses of the subject AR coating of FIG. 6.

A typical illustration of the change in reflectance with the thickness of a single-layer AR coating is shown in FIG. 5. The reflectance of the 250 nm layer at 500 nm optical wavelength is equal to that of an uncoated substrate, while that of a 387 nm layer (¾ wave at 516 nm) is reduced to a value equal to that observed for the ¼ wave layer (125 nm) at 500 nm. In other words, a fluorocarbon composition is not, in itself, adequate to provide AR properties. The thickness of the layer must be chosen and precisely controlled for AR properties to be achieved. In the case of a single-layer fluoropolymer film, local minima of the perceived reflectance function F are obtained when the optical thickness is odd multiples of 550/4. (Optical thickness, $nd_r$, is the product of the index of refraction, n, of a layer, and its physical thickness, $d_r$.)

Figure 6:
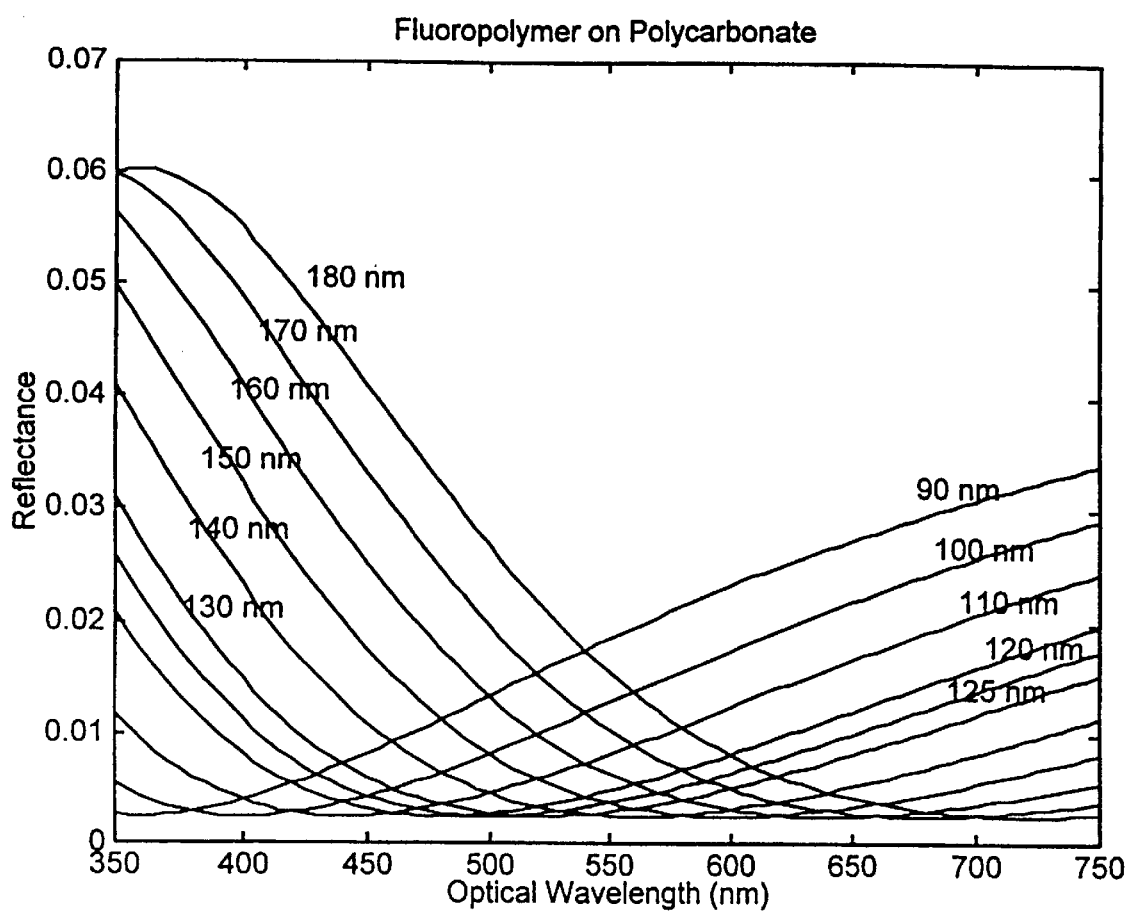
FIG. 6 is a plot of reflectance as a function of wavelength for several optical thickness of an AR coating according to another embodiment of the invention.
Figure 7:
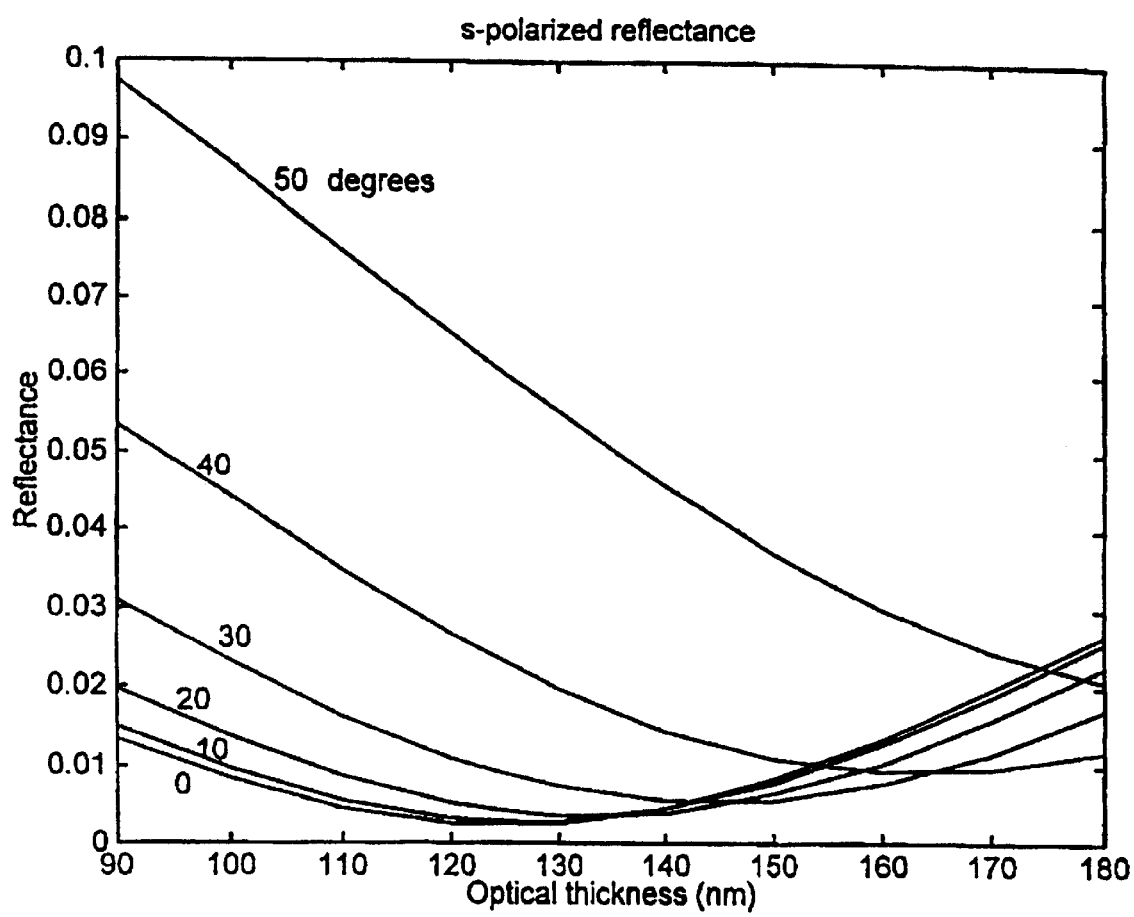
FIG. 7 is a plot of s-polarized reflectance as a function of optical thickness over several angles of incidence for an AR coating according to another embodiment of the invention.
Figure 8:
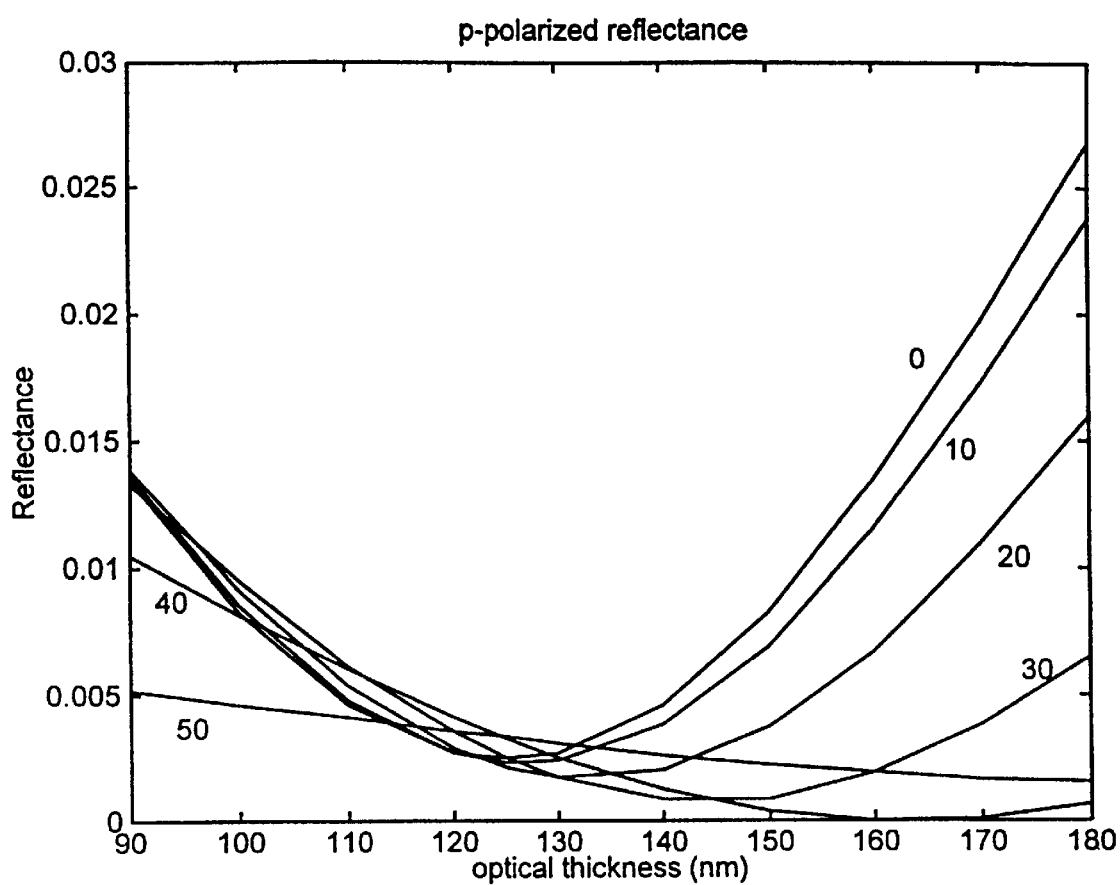
FIG. 8 is a plot of p-polarized reflectance as a function of optical thickness over several angles of incidence for the subject AR coating of FIG. 5.

An important feature of the present invention is that the reflection of polarized light at one or more wavelengths and one or more angles of incidence is used to monitor and control the growth of the AR coating. After selecting layer thickness(es) and composition(s), equations (2) through (6) are solved for discrete values of layer thickness up to and including the preferred thickness. For each intermediate thickness, the results are three-dimensional surfaces, one for s-polarized reflectance and one for p-polarized reflectance, as shown in FIGS. 1 and 2. FIG. 6 shows cross-sections of these surfaces at normal incidence (θ=0) for a polymeric fluorocarbon film on polycarbonate, with optical thickness ranging from 90 nm to 180 nm and optical wavelengths between 350 and 750 nm. FIGS. 7 and 8 show cross-sections through the same surfaces at 0,10,20,30,40, and 50 degree angles of incidence and a fixed wavelength of 500 nm. (Recall from equation (5) that p- and s-reflectance are identical at normal incidence.)

Using the variation of reflectance, $R(\lambda,\theta,P)$, with film thickness, one or more probe wavelengths and one or more probe angles are selected for in situ optical monitoring of the AR coating process. The selection is based on the variation of reflectance over the range of thickness where control is needed, for example when switching between two film precursors. Preferably, the probe wavelength is further selected such that wavelengths where plasma emission would interfere with the detector are avoided. In like manner, the probe angle is constrained by the geometry of the reactor and common sense; angles less than about 5° or equal to about 90° should be avoided, as should angles where the electrodes or other structural elements could interfere with the transmission or reception of the probe light beam.

Film growth on the substrate is monitored optically using an optical radiation emitter, e.g., a polarized, light-emitting diode, and a detector, such as a polarizing optical filter in combination with a photodiode. Measurements from the film growth monitor are used by a feedback system to control the deposition rate of the films, allowing coatings with prescribed anti-reflection properties to be produced. The feedback system controls deposition rate by controlling the precursor flow rate, plasma excitation, and/or chamber pressure.

Figure 9:
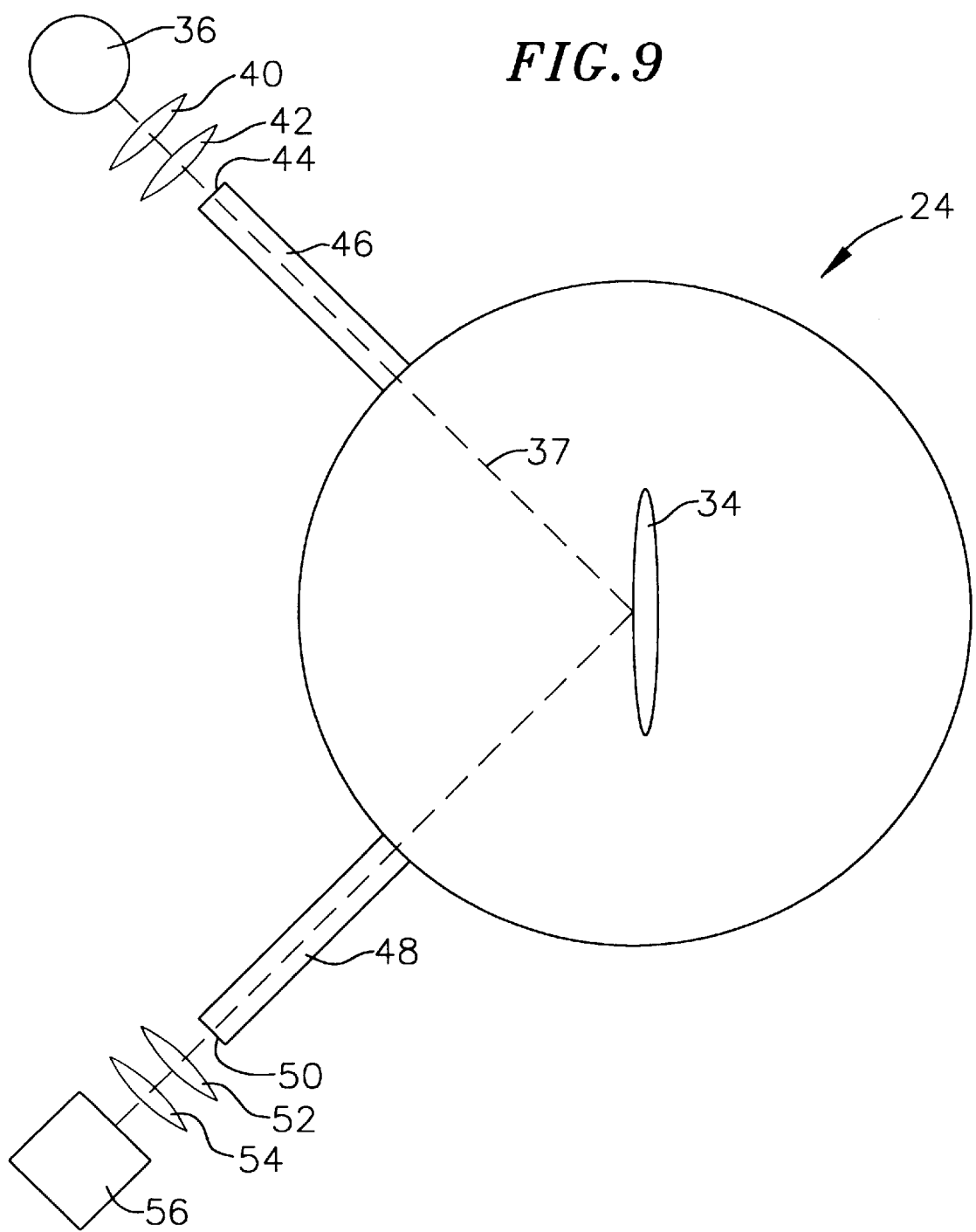
FIG. 9 is a schematic drawing of an apparatus for optically monitoring film growth on the substrate.

One embodiment of the optical monitor 14 is schematically illustrated in FIG. 9. A light source 36 emits a probe light 37 with a defined wavelength and polarization. In this embodiment, the light source 36 is a lamp 38 with a polarizing filter 40 and an interference filter 42. Alternatively, the light source is a laser or a polarized light emitting diode. The probe light beam can be monochromatic, but this is not required. The wavelength of the probe light may comprise a narrow or even moderate bandwidth, as long as it provides readily detectable changes in reflectance at the desired deposition thickness for the feedback system, discussed in more detail below. The wavelength, or bandwidth, of the filtered probe light is selected to be different from the wavelengths of ambient light or light emitted by the active plasma during PECVD. The probe light has a defined incident angle θ on the substrate surface. The probe light passes through a window 44 en route to the substrate. The face of the window 44 is positioned perpendicular to the incident probe light beam, and the window is mounted at the end of a narrow tube 46, which should be long enough to preclude film deposition on its inner surface, e.g., typically more than four times its diameter.

The angle of incidence of the probe light on the substrate is constrained in part by the arrangement and optical properties of window 44. The angle can range from 0 to 90°, with a preferred angle between about 5° and 50° to avoid interference by reflections from the window surfaces and to ease alignment.

A portion of the probe light reflects off of the substrate surface, while an unreflected portion is refracted and/or absorbed as it passes through the deposited film and underlying substrate. The reflected portion of the probe light passes through a suitably positioned detector arrangement, which includes a tube 48, window 50, interference filter 52, polarization filter 54, and a detector 56, e.g., a compact photomultiplier or photodiode. Again, the length of the tube 48 should be about four times its diameter to shield the window surface from film precursors. The influence of plasma light emission is controlled by selection of a probe wavelength, or bandwidth, at which the plasma does not emit. The interference and polarization filters allow throughput of only the probe light wavelength, thereby ensuring an accurate reading of the intensity of the reflected portion of the probe light.

Figure 10:
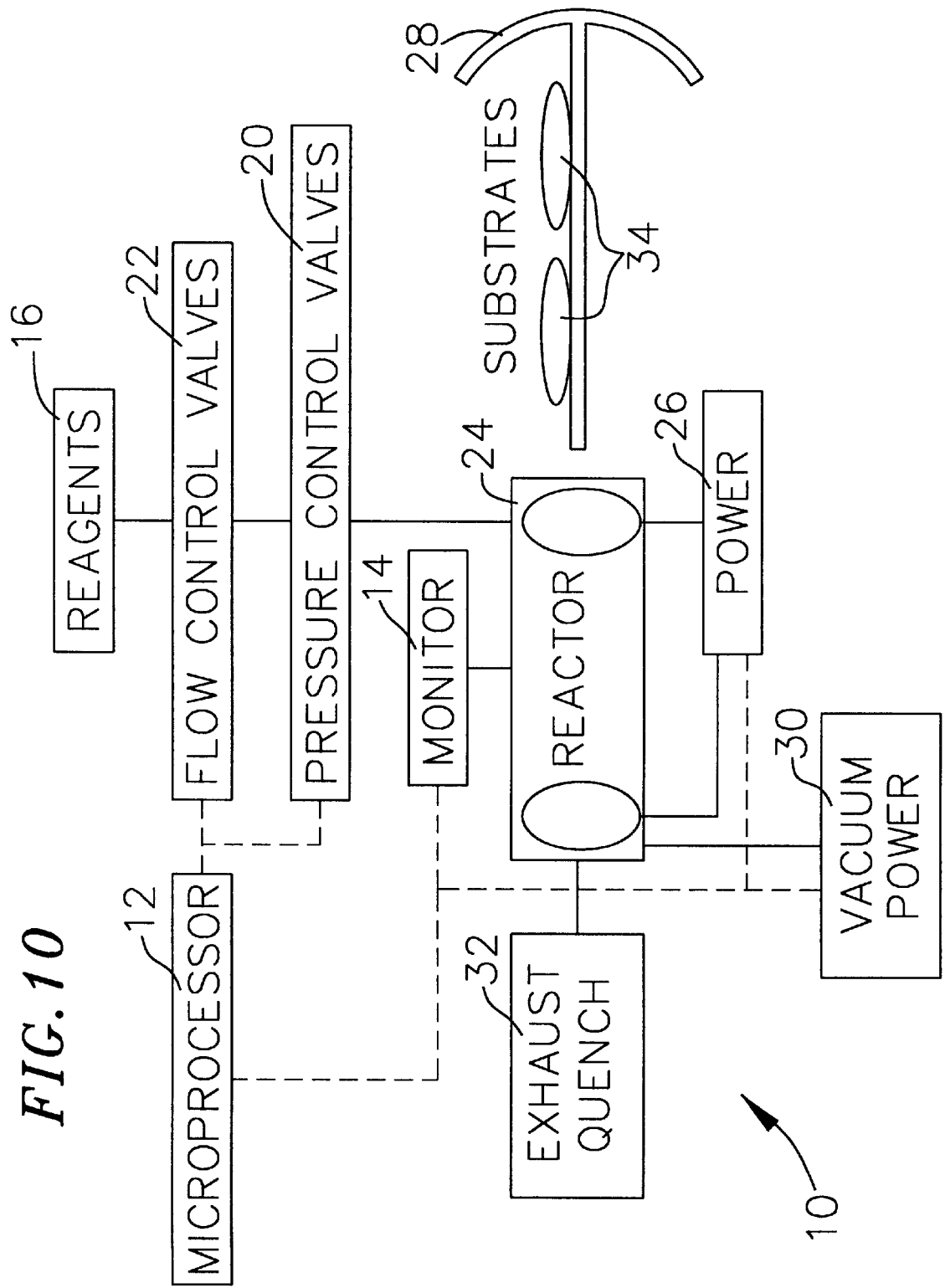
FIG. 10 is a schematic drawing of a preferred apparatus for producing AR coatings on optical substrates according to the present invention.

FIG. 10 schematically illustrates a plasma enhanced chemical vapor deposition (PECVD) apparatus 10 according to a preferred embodiment of the invention, with physical dimensions tailored to accommodate a pair of ophthalmic (spectacle) lenses, which may be glass or plastic (e.g., polycarbonate, bis-phenol A resins such as CR-39™, available from PPG Industries, etc.). The PECVD apparatus includes a microprocessor 12, optical monitor 14, reagent source 16, inlet manifold 18, pressure control valve 20, flow control valve 22, plasma reactor 24, power supply 26, substrate holder 28, vacuum pump 30, and exhaust filter 32. Plastic or glass ophthalmic substrates 34,35 are mounted or placed on the substrate holder 28 and inserted into the plasma reactor chamber, which preferably has a volume of less than about twice that of the substrate(s) to be coated.

PECVD involves placing the substrate in a reactor chamber, passing at least one precursor material capable of forming the desired layer through the chamber in a laminar flow relative to the coating surface and at a suitable pressure, and then generating an electric field to form a plasma with the precursor(s). The coupling of energy into the gas occurs via electric fields that can be static (d.c. coupled), or dynamic (a.c. coupled). A.C. coupling can be either capacitive, inductive, or both. The precursor(s) breaks down and reacts in the plasma and on the coating surface to form the desired layer. Depending on the composition of the precursor(s), the electric field strength, and other parameters, the film can have extended arrays of regularly repeating molecular constituents, amorphous regions, or mixtures of ordered and unordered polymeric regions.

Most of the precursor compounds listed in Table I are liquids at room temperature and pressure. In a preferred embodiment, the liquid precursor is degassed by cooling it and then subjecting it to a vacuum. Depending on its boiling point, the liquid is then heated to ambient temperature or higher in order to provide sufficient positive vapor pressure to flow through a channeling system. Alternatively, a carrier gas, such as helium, can be blown through the liquid to obtain a dilute vapor mixture of desired composition.

Gaseous precursors that form the AR coatings of the present invention can be supplied from an external source through a series of inlet pipes and into the reactor chamber. The technical particularities of channeling the various gases into the reactor chamber are well-known in the art.

The flow of carrier and reactant gases into the reactor can be controlled by flow control valves, which are well-known in the art and serve both to measure the flow of gases and to control such flow. Furthermore, the carrier gas, when used, can be premixed with the gaseous reactants or fed into the central feed line by a separate inlet.

As shown in FIG. 10, the pressure and flow of the precursor gas into the plasma reactor 24 are electronically controlled by flow control valves 22. The chamber temperature is preferably at or near ambient temperature.

The apparatus 10 includes a feedback system to allow precise control over the deposition of an AR coating on the substrates. The AR coating may consist of a single layer or multiple layers, each layer having a predetermined thickness. It is important that the thickness of each layer precisely corresponds to the predetermined design thickness to maximize the anti-reflection properties of the coating. The feedback system measures the thickness of each layer as it is being deposited and controls the deposition rate accordingly in order to precisely control the thickness of the deposited layer. The feedback system includes microprocessor 12, optical monitor 14, and one or more of the pressure control valve 20, flow control valve 22, and plasma reactor 24, including a plasma generator and a reactor chamber, and power supply 26. Preferably, the microprocessor is linked to all of the control values and the power supply. The primary control elements governed by the microprocessor 12 in response to a feedback signal from the optical monitor 14 are the gas flow rates through the flow control valve 22 and the plasma excitation by the power supply 26 for the plasma reactor 24. In some embodiments, it is advantageous to regulate the chamber pressure with the pressure control valve 24 when switching between the steps of cleaning or etching the substrate(s) and depositing multiple layers of coating materials.

The following are some examples of reflectance profiles calculated from equations (1)–(6) for different AR coatings. It is intended that these examples be considered as illustrative of the invention, rather than limiting what is otherwise disclosed and claimed herein.

FIGS. 1 and 2 illustrate the reflectance of the s- and p-polarized components of an unpolarized light source from a typical two-layer AR coating on a plastic ophthalmic substrate. The calculation is shown for a 135 nm layer of fluoropolymer ($CF_x$) over a 200 nm layer of $SiO_2$ on a polycarbonate substrate.

FIG. 7 shows s-polarized reflectance from thin fluoropolymer films at 500 nm optical wavelength, calculated at six different angles of incidence ranging from 0 to 50 degrees.

FIG. 8 shows p-polarized reflectance from thin fluoropolymer films at 500 nm optical wavelength calculated at six different angles of incidence from 0 to 50 degrees.

The variation of p-polarized reflected light with coating thickness and angle of incidence is quite different from that of s-polarized light, as seen by comparing FIGS. 7 and 8. Consider a desired film optical thickness of 125 nm measured with a green probe light (500 nm) at an angle of 50° as an example of this diagnostic. The s-polarized reflectance drops from 9.6% at 90 nm optical thickness to 6% as the target thickness changes from 80 to 125 nm, as shown in FIG. 7. Over the same range of film thicknesses, the p-polarized reflectance drops from 0.5% to 0.4% (FIG. 8), a much smaller and more difficult change to measure accurately. All other factors being equal, the s-polarized signal would be selected for feedback control of the deposition process at a 50° angle of incidence of the light probe.

In other words, in one aspect of the invention, a target optical thickness is identified for one or more layers, and equations (1)–(6) are then solved to find the variation of polarized reflectances wiThth wavelength, angle of incidence, and layer thickness. One or more angles and one or more wavelengths are chosen to probe (monitor) the layer during deposition. When the reflected light intensity reaches the value calculated for the target thickness at the chosen wavelength(s) and angle(s), the deposition process is terminated, by e.g., the microprocessor 12. This approach is easily generalized to more than one layer.

Figure 11:
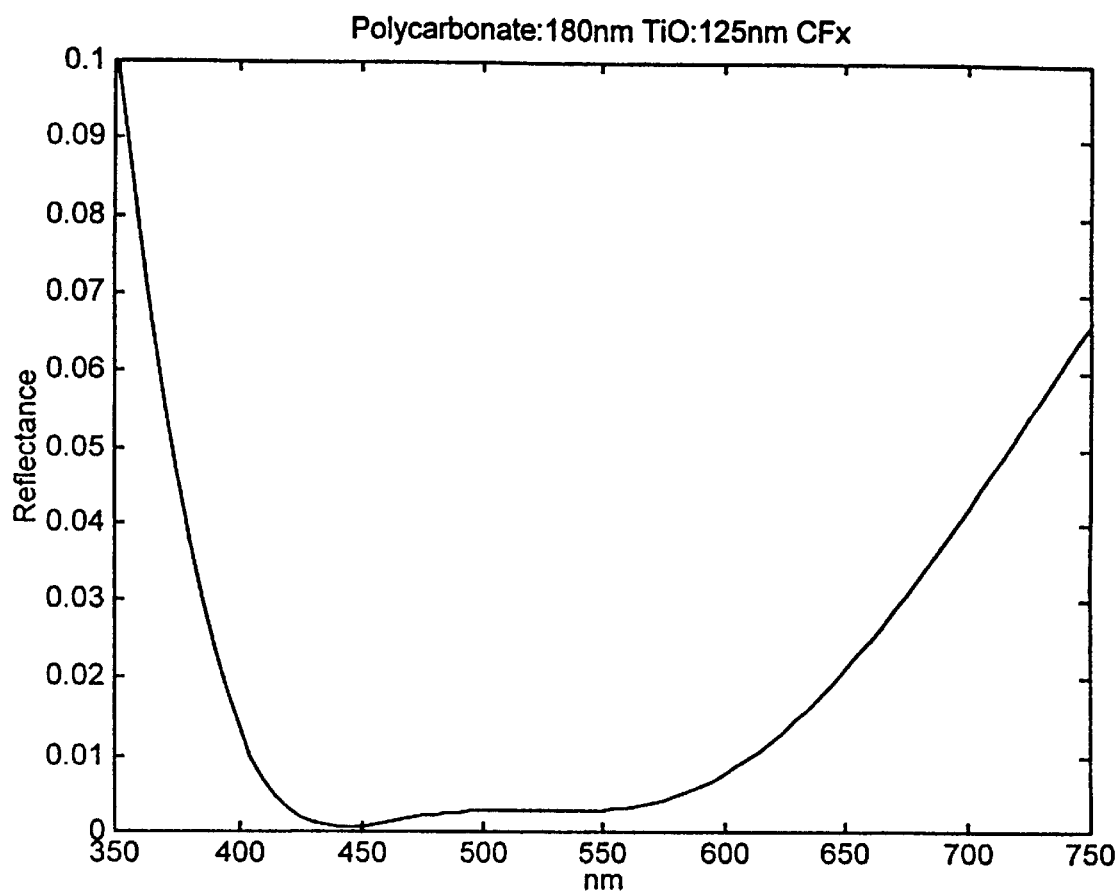
FIG. 11 is a plot of reflectance as a function of wavelength for a multilayer AR coating according to another embodiment of the invention.

In some embodiments, it is advantageous to form a multilayer, rather than a single layer, coating. Multilayer coatings can provide a broader spectral region with low reflectance than can be achieved with a single-layer coating. Other material considerations include adhesion, scratch resistance, chemical resistance (such as stain resistance), wear resistance, and other desired properties. FIG. 11 provides computed average reflectance data for one nonlimiting example of a two-layer coating on a polycarbonate substrate. The first layer is TiO with a 180 nm optical thickness (81.8 nm physical thickness), formed by chemical vapor deposition of $Ti(i\text{-}PrO)_4$. This is followed by a layer of fluorocarbon ($CF_x$) film (125 nm optical thickness), made using $c\text{-}C_4F_8$ as a precursor. Note that the region of low reflectance is broadened compared to that found for a simple $CF_x$ coating in FIG. 6.

Figure 12:
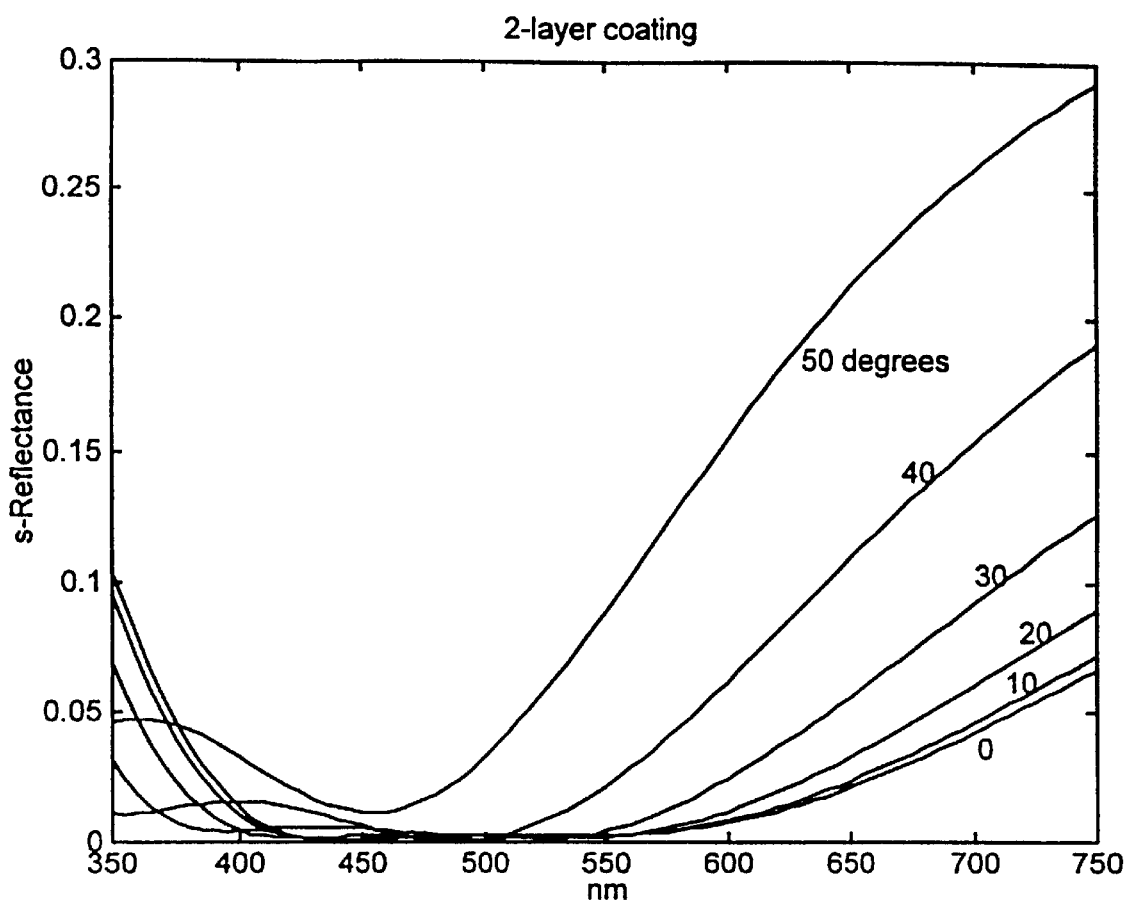
FIG. 12 is a plot of s-polarized reflectance as a function of wavelength for the subject AR coating of FIG. 11.

As with single layer AR coatings or films, the polarized reflectance at various angles and wavelengths can be used to control the deposition process in the preparation of a multilayer AR film. For example, FIG. 12 shows the s-polarized reflectance at angles from 0–50° for a finished two-layer coating. A family of curves similar to those shown in FIGS. 7 and 8 for the single fluoropolymer coating can be used to compute polarized reflectance, with selected values of polarized reflectance corresponding to a desired thickness triggering the switch from the TiO precursor to the $CF_x$ precursor.

Unpolarized probe light may also be resolved using a polarizing beamsplitter between the polarization filter 54 and two matched detectors, which replace the single detector 56 (FIG. 9). The ratio of the detector outputs is equal to the ratio of the square of the corresponding Fresnel reflection coefficients, calculable from equations (1)–(6) above. This ratio yields a response surface characterized by the ratio of FIGS. 1 and 2 for a single thickness film and a family of such surfaces for a growing film or multilayer.

In some embodiments, it is advantageous to select more than one incident probe light wavelength and/or polarization, particularly if more than one precursor is used, or if one wavelength is optimal for the cleaning step and a different wavelength is preferred for deposition.

The composition of the substrate enters into equation (2) through its optical admittance, $y_o$. As a practical matter, differences in the thickness of the substrate do not enter the equations, since the thickness of ophthalmic substrates is much greater than the optical wavelengths of incident light. The shape of the substrate does not enter the equations as long as the ratio of the substrate's radius of curvature through the radius of the spot of light where the probe contacts the lens is much greater than one, a condition that is always satisfied for a sufficiently small probe spot on the ophthalmic substrates.

According to one embodiment, prior to film deposition, the substrate is cleaned by exposing it to a plasma of inert gas ions, reactive radicals, or by other means known in the art. The method of generating and applying the electric field to create the plasma is not critical to this process. For example, the field may be generated by direct, inductive, or capacitive coupling systems. Non-limiting examples of such systems are found in *Thin-Film Deposition, Principle and Practice* by Don Smith, (New York: McGraw Hill) 1995.

The step(s) used to clean a substrate vary with substrate composition, the degree and type of contamination, and the range of plasma conditions resulting from flow and electrical constraints of the particular plasma chamber used. It is common, for example, to etch away organic material with an oxygen plasma for a few minutes prior to thin-film deposition. Etching of organic contaminants and surface oxide can also be accomplished by discharged halogenated gases such as HBr.

In one embodiment, the cleaning step is initiated by activating the vacuum pump 30 and admitting Ar gas to the tube at pressures of 1–20 millibar. A plasma is ignited by applying 50 kHz power to annular electrodes mounted inside (for direct coupling) or outside (for capacitive or inductive coupling) of the plasma reactor 24. Electrons, Ar ions, excited species, and light impinge upon both sides of the substrate, removing adsorbed impurities and activating the surface for adhesion of the AR coating.

This surface preparation may modify the refractive index of the surface layers. The modification of the refractive index can also be used to optically monitor the cleaning step. A change in the refractive index of the surface layer causes a change in the Fresnel reflection from that surface, a change that can be measured with the optical monitor 14. The cleaning step can thereby be controlled using the feedback system of the present invention, as described above, by continuing the cleaning step until a desired refractive index corresponding to a sufficiently cleaned substrate is detected.

According to another embodiment, the cleaning process is monitored by observing fluorescence from impurities as they are purged from the plasma reactor 24. For example, excited OH is produced from dissociative excitation of water vapor by electron impact, which produces observable fluorescent emissions. As the water vapor concentration in the plasma reactor 24 decreases during plasma cleaning, the intensity of these fluorescent emissions decays.

The reactor chamber is evacuated prior to entry of the gaseous reactants. Chamber pressures suitable for the process of the present invention are generally less than one twentieth of one atmosphere and typically lie within the range of about 50 mTorr to about 10 Torr.

As the precursor(s) enter the reaction chamber after the coating surface is cleaned and treated as described above, an electric field is generated under preselected frequency and power conditions to ionize the gas mix, thereby forming a plasma. When a discharge is produced at a low pressure in the film-forming gaseous precursor(s), the precursor(s) become ionized, forming a plasma. A portion of the material is in the form of ions, electrons, and neutral free radicals generated in the plasma prior to formation of the film over or upon the substrate. Methods of generating an electric field between electrodes are well-known in the art and described, for example in *Thin Film Deposition: Principal and Practice* (ibid.)

A preferred deposition rate is between about 0.1 and 10 nanometers per second; however, rates up to about 65 nm/sec are possible. The deposition rate is constrained only by the rate at which a homogenous plasma can be produced in order to form a uniform deposited layer.

Preferably, the AR coating is continuously deposited with no interruption between layers. This is accomplished by reducing the flow rate of a first precursor while simultaneously initiating an increase in the flow of the second precursor such that both materials are being deposited simultaneously. In this manner, more gradual changes in the refractive index profile may be created. Alternatively, there may be cases where an intermediate cleaning or activation step is desirable, e.g. to relax internal stresses or improve adhesion at the interface between layers.

Preferably, the multilayer AR coating is "capped" with an optically thin (e.g., $nd_r < 20$ nm) layer of hydrophobic material. For example, a hydrophobic, polymeric fluorocarbon film can be made from a precursor such as a perfluorinated organic compound, e.g. perfluorocyclobutane($c\text{-}C_4F_8$), trifluoromethane ($HCF_3$) tetrafluoroethylene ($C_2F_4$) or hexafluoropropene ($CF_3)_6$. The presence of such a layer makes it easier to clean the coated substrate, and inhibits formation of water or grease spots.

According to another embodiment of the invention there is a smooth transition between the cleaning step and the deposition step. Near the end of the cleaning cycle, deposition precursor material is bled into the chamber, and the cleaning reagent, e.g. oxygen, is gradually restricted in a balanced way so that the surface is continually bombarded by energetic particles during formation of the first layer of film. This is important, as an impurity present at a concentration of even $10^{-6}$ Torr will form a monolayer in less than one second. Switching smoothly from cleaning to deposition in this manner also improves adhesion of the film.

PECVD by reactive ions is appropriate for coating substrates with regular, as well as irregular, surfaces, including the ledges found on bifocal ophthalmic lenses. During deposition, the direction of the ionic flux that produces the thin-film coating is determined by the electrostatic sheath and the ratio of the ion thermal temperature (in eV) to the sheath potential. The sheath is oriented normal to the tangent plane at the substrate surface and is not modified when the spatial scale of the structure is smaller than about 10 Debye lengths. A Debye length is a plasma parameter that describes the distance over which an electric field can be maintained in the electrically conducting plasma medium. If the number of electrons per cubic centimeter is Ne and the electron temperature in eV is $T_e$, then the Debye length, 1, in centimeters is $$\iota = 525(T_e N_e^{-1})^{1/2} \qquad (8)$$

Under a typical set of plasma conditions, with an electron density of $10^{-1}$ cm$^{-3}$ and an electron temperature of 2 electron volts (eV), this Debye length is 0.02 cm, so features with a radius of curvature less than about 10 l=2 mm will not affect the direction of the sheath electric field. The angular divergence of the ion flux is given by the inverse tangent of the square root of the ratio of the ion thermal energy to the sheath potential:

$$\theta = \tan^{-1}(T_i V_{sheath}^{-1})^{1/2} \qquad (9)$$

This angular divergence is 9° for a typical ion temperature of 600° K. and a sheath potential of 2 eV. This angular averaging produces more uniform coverage over topography than would be the case for a monoenergetic ion beam with no transverse energy.

Conformal coverage over steps of practical interest to ophthalmic substrates, for example, ledges for bifocal lenses, can be obtained by altering the plasma conditions by, for example, raising $T_e$ or decreasing $N_e$, to extend the spatial scales for conformal coating.

It will be appreciated that, in addition to the methods and apparatus described above, the invention also provides unique articles of manufacture, characterized by low reflectance. Generally, the articles are transparent, for example, ophthalmic lenses, windows, windshields, television screens and computer monitors, etc. Transparent articles and substrates have no absorption of light over the region of the spectrum sensed by the human visual system, that is between about 350 and about 750 nm.

In some embodiments, however, the article may be translucent. Translucent articles and substrates transmit light at some visible wavelengths but absorb some or all of the light at one or more visible wavelengths. Nonlimiting examples of translucent, articles include tinted and shaded sunglasses, stained-glass windows, and tinted windshields.

Figure 13:
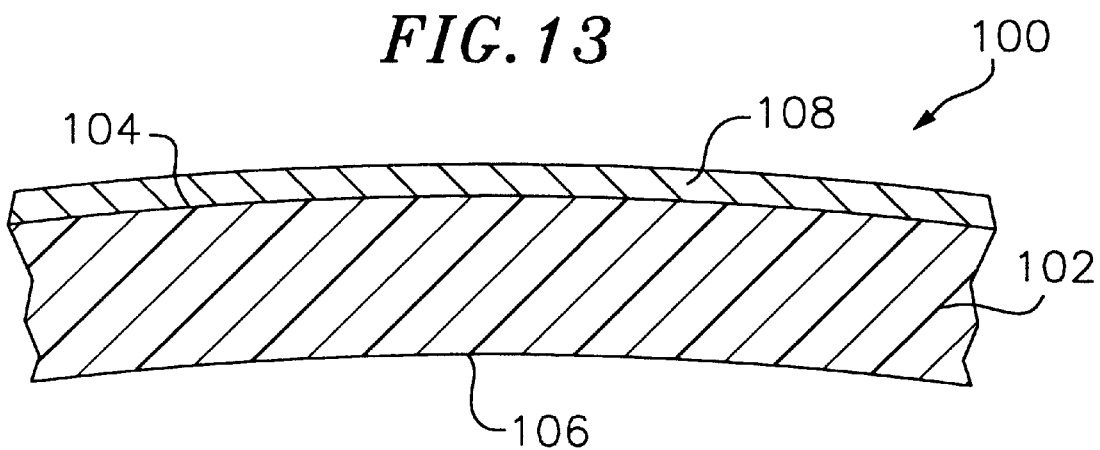
FIG. 13 is a schematic cross-sectional view of an ophthalmic lens made in accordance with the present invention, with a single AR layer.

In one embodiment, a transparent or translucent low-reflection article comprises an optical substrate and one or more layers of AR material. Preferably, at least one of the layers is a thin fluoropolymer film. FIG. 13 is a schematic illustration of the cross-section of one such article, a spectacle lens 100. The lens consists of an optical preform 102 having opposed first and second surfaces 104, 106 and a layer of AR material 108 coated (more precisely, deposited) on at least a portion of the first surface 104 of the ophthalmic lens. In other embodiments (not shown), the AR material is deposited on the bottom surface of the lens, both the top and the bottom surfaces of the lens, and/or the edge of the lens.

Figure 14:
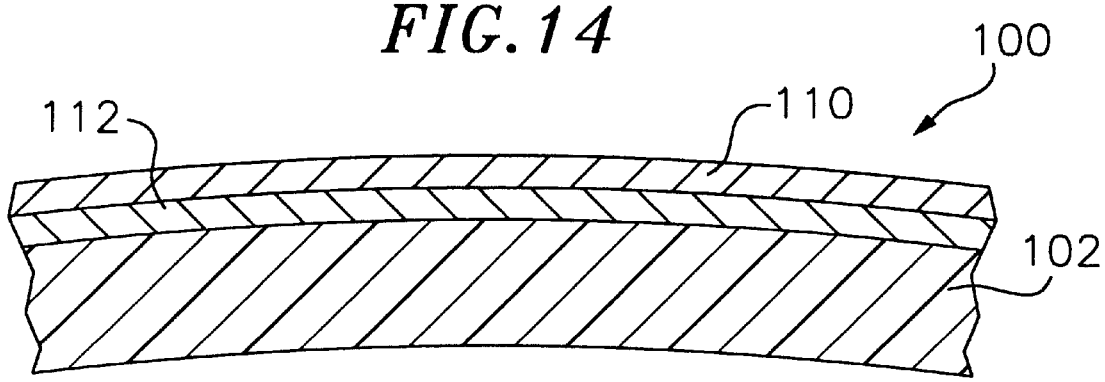
FIG. 14 is a schematic cross-sectional view of an ophthalmic lens made in accordance with the present invention, with two AR layers.

FIG. 14 is a schematic illustration of the cross section of another low reflection article, an ophthalmic lens 100. The lens consists of an optical preform 102 coated with two different layers 110 and 112 of AR material. Both layers are considered to be deposited or "coated" on the optical substrate, though, as shown, only one such layer 110 is adjacent to the substrate, the other layer 112 being adjacent to the first layer of AR material. It will be readily appreciated that low reflection articles having more than two layers of material deposited on an underlying optical substrate are also within the scope of the present invention.

The invention has been described in preferred and exemplary embodiments, but is not limited thereto. A variety of modifications, modes of operations and embodiments, all within the ability and skill of those skilled in the art, can be made without departing from the present invention. For example, the AR coatings and methods of designing and applying them can be used on a variety of optical substrates in addition to ophthalmic lenses. Even large articles, like automobile windshields, can be given an AR coating if a suitably large reactor is built.

All references herein are incorporated by reference as if set forth herein in their entirety. In both the text and the claims, use of the word "about" in relation to a range of numbers is intended to modify both the high and low values stated.

We claim:

1. A transparent or translucent coated article having a perceived reflectance $F_{AR}$, wherein $F_{AR} = \int\int S(\lambda,\theta) R(\lambda,\theta) d\lambda d\theta$ where $\lambda$ is wavelength, $\theta$ is incident angle, $S(\lambda,\theta)$ is human sensitivity function as a function of the wavelength and the incident angle, and $R(\lambda,\theta)$ is an average of p- and s-polarized reflectances, the coated article comprising:

an optical substrate; and one or more layers of anti-reflection material coated on at least a portion of said optical substrate, a thickness of said one or more layers of anti-reflection material being selected such that said perceived reflectance $F_{AR}$ of said coated article is minimized.

2. An article as recited in claim 1, wherein the optical substrate is an ophthalmic lens.

3. An article as recited in claim 2, wherein the ophthalmic lens is coated with the anti-reflection material on at least a portion of one or both lens surfaces and/or its edge.

4. An article as recited in claim 1, wherein the optical substrate is a window.

5. An article as recited in claim 1, wherein the optical substrate is a television screen or computer monitor.

6. A coated article as recited in claim 1, wherein at least one layer of anti-reflection material comprises a fluorocarbon film.

7. An article as recited in claim 6, wherein the fluorocarbon film is a plasma deposition product of a perfluorinated organic compound.

8. An article as recited in claim 7, wherein the perfluorinated organic compound is a perfluoroaliphatic or perfluorocycloaliphatic compound.

9. An article as recited in claim 8, wherein the perfluorinated organic compound is selected from the group consisting of perfluorocyclobutane, hexafluoroethane, tetrafluoroethylene, perfluoropropene, and mixtures thereof.

10. An article as recited in claim 6, wherein the fluorocarbon film comprises polytetrafluoroethylene.

11. A coated article as recited in claim 1, wherein at least one layer of anti-reflection material comprises an organic or organosilicon film.

12. A coated article as recited in claim 1, wherein at least one layer of anti-reflection material comprises a plasma-enhanced chemical vapor deposition product of one or more precursors selected from the group consisting of Si $(CH_3)_4$, HSi $(CH_3)_3$, thiophene, furan, benzene, $Ti(OC_2H_5)_4$, $Ti(OC_3H_7)_4$, $Ti(N(C_2H_5)_2)_4$, and perfluorinated organic compounds.

13. An article as recited in claim 1, wherein each layer of anti-reflection material has a physical thickness greater than about 5 nm and less than about 1 micron.

14. An article as recited in claim 1, further comprising an optically thin metal layer deposited on the optical substrate and/or on a layer of anti-reflection material.

15. An article as recited in claim 1, further comprising a layer of hydrophobic material.

* * * * *